United States Patent [19]

White

[11] 3,997,237
[45] Dec. 14, 1976

[54] SOLDER TERMINAL
[75] Inventor: Donald Richard White, York, Pa.
[73] Assignee: E. I. Du Pont de Nemours and Company, Wilmington, Del.
[22] Filed: Feb. 20, 1976
[21] Appl. No.: 659,847
[52] U.S. Cl. .................. 339/275 B; 339/221 R; 29/624; 174/88 R
[51] Int. Cl.² ........................................ H01R 9/06
[58] Field of Search ....... 339/275 B, 17 LC, 220 R, 339/221 R, 221 M; 29/624; 174/88 R

[56] References Cited
UNITED STATES PATENTS

| | | | |
|---|---|---|---|
| 3,670,294 | 6/1972 | Johnson et al. | 339/221 M X |
| 3,744,129 | 7/1973 | Dewey | 29/624 |
| 3,827,004 | 7/1974 | Heuvel et al. | 339/221 R |
| 3,905,665 | 9/1975 | Lynch et al. | 339/275 B X |
| 3,915,546 | 10/1975 | Cobaugh et al. | 339/275 B |

Primary Examiner—J. Howard Flint, Jr.

[57] ABSTRACT

An electrical terminal includes a mounting portion for insertion in a hole in a circuit board, a rectangular seating portion joining the mounting portion including a pair of shoulders for engaging a surface of a circuit board when the mounting portion is inserted in a hole in a circuit board. The seating portion includes a hole transverse to the mounting portion, and a cold-formed solder element extending through the hole. Each end of the solder element is cold formed to provide a mass of solder on each surface of the seating portion.

4 Claims, 5 Drawing Figures

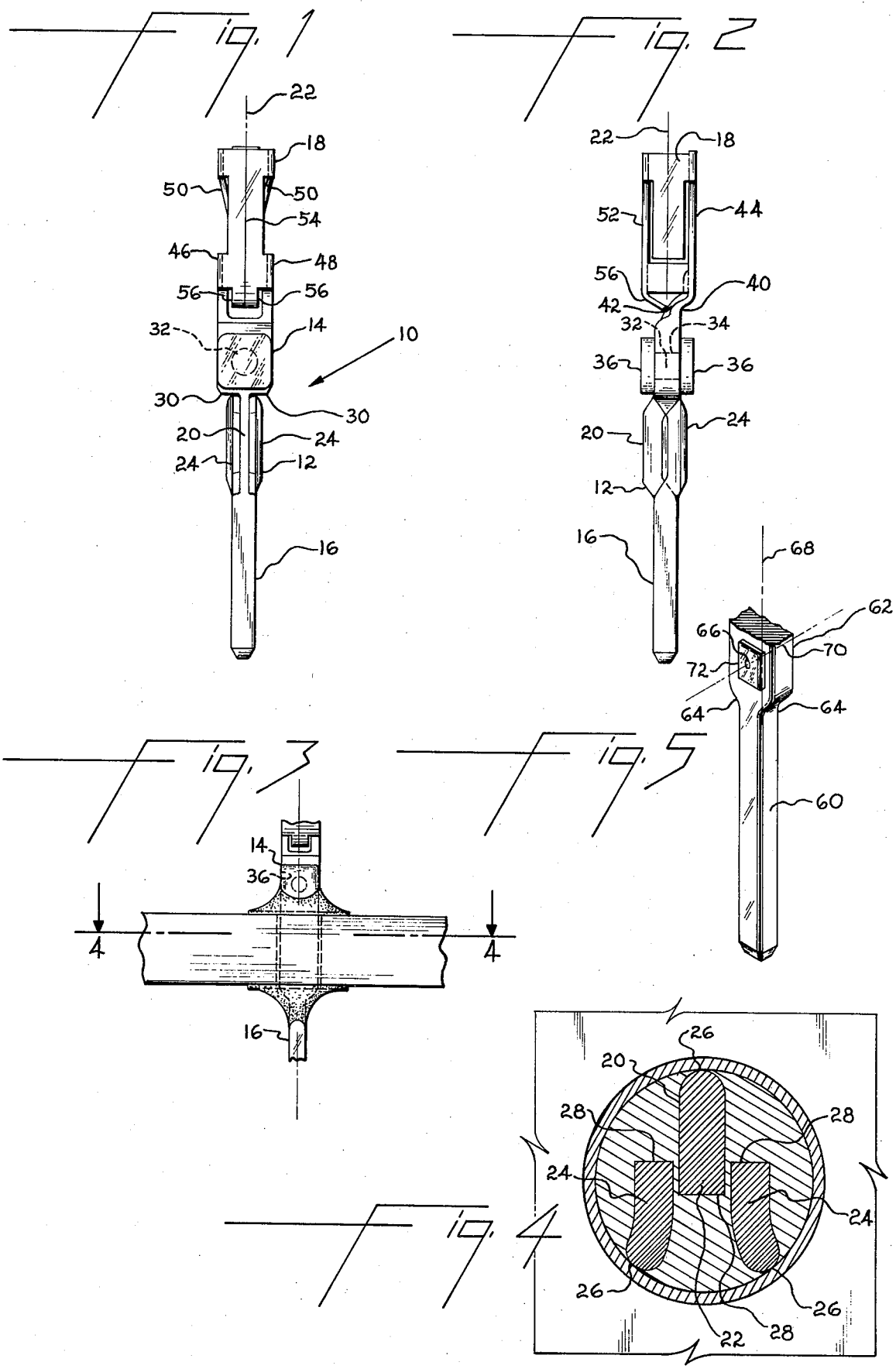

SOLDER TERMINAL

BACKGROUND OF THE INVENTION

1. Field of the Invention:

The present invention relates to electrical terminals adapted for mounting in a hole in a circuit board, and particularly relates to such terminals that are to be mounted in a plated hole in a circuit board and subsequently soldered to establish an electrical connection between the terminal and conductive paths on the circuit board connected with the plated hole in the board. More particularly, the invention relates to an electrical terminal including a quantity of solder applied to the terminal which may be flowed by heating to establish a permanent electrical connection between the terminal and a plated hole in a circuit board in which the terminal is mounted.

2. Description of the Prior Art:

Electrical terminals including a quantity of discrete and continuous solder wire are described in U.S. Pat. Nos. 3,351,704 and 3,705,256, respectively. A bus bar having a plurality of apertures with solder preforms retained in the apertures is described in U.S. Pat. No. 3,744,129. A circuit board pin is then inserted in a hole in the solder preform in the aperture in the bus bar and the bus bar and pin are heated to flow the solder and establish a permanent electrical connection.

An electrical terminal including a flow-deposited quantity of solder or band of solder adhered to a selected portion of the terminal is described in U.S. Pat. No. 3,915,546. The solder layer or band described in this patent is selectively applied to a mounting portion of a circuit board pin for insertion in a plated hole, and the solder is reflowed when the pin is inserted in a plated circuit board hole to establish a permanent electrical connection between the terminal and plated hole.

The terminal structure including a band of solder applied to the mounting portion is particularly useful when the terminal is a circuit board pin having a wire wrap tail at one end and a pressure contact at the other end. The band of solder may be reflowed after the terminal is inserted in a circuit board hole without contaminating the wire wrap tail or pressure contacts thus eliminating masking and expensive cleaning of either the wire wrap tail or contacts, which would be required if the soldering had been effected by a dip or wave soldering operation.

However, the selective application of the solder band requires an additional manufacturing operation after die stamping of the electrical terminal and expensive and complex manufacturing equipment for carrying out such operations. Additionally, operations are required on such terminals to reduce the force required to insert the solder striped contacts into plated holes in a circuit board and to reduce the damage to the plated hole caused by frictionally interfitting the solder striped contacts therein. Additionally, the quantity of solder that can be adhered to the mounting portion of such a terminal is limited by the requirement that the solder striped contact must fit in a standard size hole in a circuit board.

SUMMARY OF THE INVENTION

The present invention provides a solution to all of the above problems by providing a terminal having a mounting portion, a seating portion joining the mounting portion including a transverse hole, and a cold-formed solder element through the hole having expanded ends to provide for retention of the solder on the seating portion and a sufficient quantity of solder to insure a reliable, permanent, soldered, electrical and mechanical connection between the terminal and a plated hole in a circuit board by heating and flowing the solder mass.

Additionally, since the solder element is cold formed from conventional solder wire, it may be inserted in the hole in the seating portion and formed during die stamping of the terminal using a progressive die.

BRIEF DESCRIPTION OF THE DRAWINGS

FIG. 1 is a front view of a socket terminal embodying the present invention.

FIG. 2 is a side view of the socket terminal of FIG. 1.

FIG. 3 is a front view of a socket terminal embodying the invention inserted in a hole in a circuit board.

FIG. 4 is a plan view in section taken along line 4—4 of FIG. 3.

FIG. 5 is a perspective view of an alternate embodiment of a terminal according to the invention.

DESCRIPTION OF PREFERRED EMBODIMENTS OF THE INVENTION

A preferred embodiment of the present invention is described below with reference to the attached drawings wherein the same numerals are used throughout the various views to describe the same elements.

A preferred embodiment of the invention comprises a terminal 10 having a mounting portion 12, a seating portion 14, a uniform cross section wire wrap tail 16 and a socket 18.

The mounting portion 12 comprises three longitudinally extending fins 20, 24. The first fin 20 extends lengthwise in cross section radially away from a central longitudinal axis 22 of the mounting portion 12, and a pair of longitudinally extending fins 24, offset from the axis 22, extend in cross section laterally away from the first fin. Each fin 20, 24 includes a rounded hole-engaging surface 26 on the edge of the fin away from the axis 28. The adjacent interior edges 22 of each fin 20, 24 are sheared longitudinally along their length. Circuit board pins including such a deformable mounting portion are described in copending application Ser. No. 614,427, filed Sept. 18, 1975.

The seating portion 14 comprises a generally rectangular member joining the mounting portion 12 having a pair of shoulders 30. A hole 32 extends through the seating portion transverse to the axis 22 of the mounting portion 12. A solder wire 34 extends through the hole 32 and has a cold-formed, expanded end 36 on each side of the seating portion 14.

The socket 18 is formed of reduced thickness material and includes a transition section 40 having a strengthening rib 42 connecting the seating plane 14 to a back wall 44 of the socket 18. The socket 18 comprises a back wall 44, side walls 46, 48 having cantilever contact beams 50 extending inwardly in the socket 18, and a front wall 52. The front wall 52 has a seam 54. Tabs 56 at the bottom of the front wall 52 are inclined to engage the transition section 40.

The preferred embodiment of a terminal according to the present invention is particularly useful as an integrated circuit socket for receiving a male lead extending from an integrated circuit package.

As illustrated in FIG. 3, each individual terminal is mounted in a circuit board by inserting the wire wrap tail 16 through a plated hole in the board until the mounting portion 12 of the terminal is inserted in the hole and shoulders 30 on the seating portion engage the surface of the circuit board. Spring properties of the several fins 20, 24 provide for retention of the terminal in the proper orientation. The terminal and plated hole are then heated, e.g. by infra-red radiation, to flow the cold-formed ends 36 and solder wire 34 mounted to hole 32 in the seating portion 14. The molten solder flows into the mounting portion 12 of the terminal 10 filling the open area between the fins 20, 24, the interior of the plated hole and forming 360° fillets with the plating on the upper and lower surface of the plated hole in the circuit board. The molten solder is then cooled to form a permanent electrical and mechanical connection between the mounting portion 12 of the terminal 10 and the plated hole.

In an alternate embodiment of a terminal according to the invention, the mounting portion comprises a uniform cross section, square circuit board pin 60. A seating portion 62 joins the pin 60 and includes a pair of shoulders 64. A hole 66 extends through the seating plane transverse to the axis 68 of the pin 60. A solder wire 70 extends through the hole 66 and has a cold formed expanded end 72 in each side of the seating portion 62. The end of the terminal opposite the pin 60 may include a socket or pin adapted for making an electrical contact.

What is claimed is:

1. In a terminal adapted for insertion in a plated hole in a circuit board including a mounting portion and a seating portion joining the mounting portion, the improvement comprising said seating portion including a hole extending therethrough transverse to a longitudinal axis of said mounting portion, and a cold formed solder element extending through the hole having expanded ends providing a solder mass at each opening of said hole on opposite sides of said seating portion.

2. A terminal, as recited in claim 1, said mounting portion comprising three longitudinally extending fins including a first fin extending in cross-section lengthwise away from a central longitudinal axis of said mounting portion and a pair of fins laterally offset from said axis and extending in cross section lengthwise away from said first fin, each fin including an interior edge which is severed from the interior edge of the adjacent fin.

3. A terminal, as recited in claim 2, additionally comprising a wire wrap tail extending from one end of said mounting portion.

4. A terminal, as recited in claim 2, additionally comprising a socket for receiving a male contact extending from said seating portion.

* * * * *

UNITED STATES PATENT OFFICE
CERTIFICATE OF CORRECTION

Patent No. 3,997,237            Dated December 14, 1976

Inventor(s) Donald Richard White

It is certified that error appears in the above-identified patent and that said Letters Patent are hereby corrected as shown below:

Column 3, line 8, "to" should read -- in --.

*Signed and Sealed this*

*nineteenth* Day of *July 1977*

[SEAL]

Attest:

RUTH C. MASON
*Attesting Officer*

C. MARSHALL DANN
*Commissioner of Patents and Trademarks*